United States Patent
Huang

(10) Patent No.: US 10,680,104 B2
(45) Date of Patent: Jun. 9, 2020

(54) METAL OXIDE SEMICONDUCTOR (MOS) DEVICE AND MANUFACTURING METHOD THEREOF

(71) Applicant: RICHTEK TECHNOLOGY CORPORATION, Zhubei, Hsinchu (TW)

(72) Inventor: Tsung-Yi Huang, Hsinchu (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 16/352,766

(22) Filed: Mar. 13, 2019

(65) Prior Publication Data

US 2019/0393346 A1   Dec. 26, 2019

(30) Foreign Application Priority Data

Jun. 21, 2018 (TW) .............................. 107121380 A

(51) Int. Cl.
*H01L 29/78* (2006.01)
*H01L 29/06* (2006.01)
*H01L 21/265* (2006.01)
*H01L 21/762* (2006.01)
*H01L 21/266* (2006.01)
*H01L 29/66* (2006.01)

(52) U.S. Cl.
CPC ........ *H01L 29/7835* (2013.01); *H01L 21/266* (2013.01); *H01L 21/26513* (2013.01); *H01L 21/76202* (2013.01); *H01L 29/0653* (2013.01); *H01L 29/6659* (2013.01)

(58) Field of Classification Search
CPC ............. H01L 29/7835; H01L 29/6659; H01L 21/266; H01L 21/76202; H01L 21/26513; H01L 29/0653; H01L 29/66659; H01L 21/26586

See application file for complete search history.

(56) References Cited

U.S. PATENT DOCUMENTS

2005/0179111 A1\* 8/2005 Chao .................... H01L 21/743
257/510

\* cited by examiner

*Primary Examiner* — David Vu
(74) *Attorney, Agent, or Firm* — Tung & Associates

(57) ABSTRACT

A metal oxide semiconductor (MOS) device includes: a semiconductor layer, an isolation structure, a well, a gate, a source, a drain, a first lightly doped region, and a second lightly doped region. The first lightly doped region is located right below a spacer layer and a portion of a dielectric layer of the gate. In a channel direction, the first lightly doped region is between and contacts the drain and an inversion current channel. The second lightly doped region includes a first part and a second part. The first part is located right below the spacer which is near the source, and the first part is between and contacts the source and the inversion current channel. The second part is located right below the spacer which is near the drain, and the second part is between and contacts the drain and the first lightly doped region.

11 Claims, 7 Drawing Sheets

METAL OXIDE SEMICONDUCTOR (MOS) DEVICE AND MANUFACTURING METHOD THEREOF

CROSS REFERENCES

The present invention claims priority to TW 107121380 filed on Jun. 21, 2018.

BACKGROUND OF THE INVENTION

Field of Invention

The present invention relates to a metal oxide semiconductor (MOS) device and manufacturing method thereof; particularly, it relates to a metal oxide semiconductor (MOS) device whose threshold voltage roll-off effect and hot carrier effect are alleviated and a manufacturing method thereof.

Description of Related Art

FIG. 1A is a schematic cross-section view showing a step of forming lightly doped regions 16a and 16b in a conventional MOS device 10. As shown in FIG. 1A, the MOS device 10 is formed on a substrate 11, and before forming the lightly doped regions 16a and 16b, a semiconductor layer 12, a well region 13, an isolation structure 14, and a gate 15 are formed. The isolation structure 14 defines an operation region 14a as a main operation region in which the MOS device 10 operates. The gate 15 includes a dielectric layer 151 and a conductive layer 152, and after the lightly doped regions 16a and 16b are formed, a spacer layer 153 is formed to complete the gate 15 (see FIG. 1B). The lightly doped regions 16a and 16b are formed by: using the dielectric layer 151 and the conductive layer 152 as a mask, and implanting N-type impurities in the form of accelerated ions into the operation region 14 by an angle α with reference to a vertical direction (as shown by the solid arrow in FIG. 1A). As shown in FIG. 1A, the lightly doped region 16a is located beneath a portion of the dielectric layer 151 of the gate 15 which is near the source 17 (see FIG. 1B), and after the source 17 is formed, the lightly doped region 16a is located between and in contact with the source 17 and the well region 13. The lightly doped region 16b is located beneath a portion of the dielectric layer 151 of the gate 15 which is near the drain 18 (see FIG. 1B), and after the drain 18 is formed, the lightly doped region 16b is located between and in contact with the drain 18 and the well region 13.

FIG. 1B is a cross-section view showing a step of forming the source 17 and the drain 18 in the MOS device 10. As shown in FIG. 1B, the source 17 and the drain 18 is formed by: using the spacer layer 153 as a mask, and implanting N-type impurities into the operation region 14 in the form of accelerated ions.

However, in the conventional MOS device, the hot carrier effect and the threshold voltage roll-off effect will cause the electronic characteristics of the MOS device 10 to be unstable.

In view of the above, the present invention provides a MOS device wherein the threshold voltage roll-off effect is alleviated without increasing the on-resistance, and a manufacturing method thereof.

SUMMARY OF THE INVENTION

From one perspective, the present invention provides a metal oxide semiconductor (MOS) device comprising: a semiconductor layer formed on a substrate, wherein the semiconductor layer has a top surface and a bottom surface that is opposite to the top surface in a vertical direction; an isolation structure formed on and in contact with the top surface, wherein the isolation structure defines an operation region; a well region having a first conductivity type, wherein the well region is formed in the semiconductor layer, and the well region is formed beneath and in contact with the top surface in the vertical direction; a gate formed on the top surface in the operation region, wherein a part of the well region is located right below and in contact with the gate to provide an inversion current channel during ON operation of the MOS device, wherein the gate includes: a dielectric layer formed on the top surface, wherein the dielectric layer is in contact with the top surface and in contact with the well region in the vertical direction; a conductive layer serving as an electrical contact of the gate, wherein the conductive layer is formed on the whole dielectric layer and in contact with the dielectric layer; and a spacer layer formed outside of the two sidewalls of the conductive layer, wherein the spacer layer serves as an electrical insulation layer of the gate; a source and a drain both having a second conductivity type, wherein the source and the drain are formed in the operation region, beneath and in contact with the top surface in the vertical direction, wherein the source and the drain are respectively located at two lateral sides of the gate, in the well region and near the gate, and the inversion current channel is located between the source and the drain in a channel direction which is a direction perpendicular to the vertical direction; a first lightly doped region having the second conductivity type, the first lightly doped region being formed in the operation region, beneath and in contact with the top surface in the vertical direction, wherein the first lightly doped region is located right below the spacer layer and a portion of the dielectric layer of the gate which are near the drain, and the first lightly doped region is located between and in contact with the drain and the inversion current channel in the channel direction; and a second lightly doped region having the second conductivity type, the second lightly doped region being formed in the operation, beneath and in contact with the top surface in the vertical direction, wherein the second lightly doped region includes: a first part formed right below and in contact with the spacer of the gate which is near the source, wherein the first part is located between and in contact with the source and the inversion current channel in the channel direction; and a second part formed right below and in contact with the spacer of the gate which is near the drain, wherein the second part is located between and in contact with the drain and the first lightly doped region in the channel direction; wherein the depth of the first lightly doped region is deeper than that of the second lightly doped region From another perspective, the present invention provides a manufacturing method of a metal oxide semiconductor (MOS) device, comprising: forming a semiconductor layer formed on a substrate, wherein the semiconductor layer has a top surface and a bottom surface that is opposite to the top surface in a vertical direction;

forming an isolation structure on and in contact with the top surface, wherein the isolation structure defines an operation region; forming a well region having a first conductivity type in the semiconductor layer, wherein the well region is formed beneath and in contact with the top surface in the vertical direction; forming a gate on the top surface in the operation region, wherein a part of the well region is located right below and in contact with the gate to provide an inversion current channel during ON operation of the MOS device, wherein the gate includes: a dielectric layer formed on the top surface, wherein the dielectric layer is in contact with the top surface and in contact with the well region in the vertical direction; a conductive layer serving as an electrical contact of the gate, wherein the conductive layer is formed on the whole dielectric layer and in contact with the dielectric layer; and a spacer layer formed outside of the two sidewalls of the conductive layer, wherein the spacer layer serves as an electrical insulation layer of the gate; forming a first lightly doped region having a second conductivity type in the operation region, beneath and in contact with the top surface in the vertical direction, wherein the first lightly doped region is located right below the spacer layer and a portion of the dielectric layer of the gate which are near the drain, and the first lightly doped region is located between and in contact with the drain and the inversion current channel in the channel direction; and forming a source and a drain both having the second conductivity type in the operation region, beneath and in contact with the top surface in the vertical direction, wherein the source and the drain are respectively located at two lateral sides of the gate, in the well region and near the gate, and the inversion current channel is between the source and the drain in the channel direction; and forming a second lightly doped region having the second conductivity type in the operation, beneath and in contact with the top surface in the vertical direction, wherein the second lightly doped region includes: a first part formed right below and in contact with the spacer of the gate which is near the source, wherein the first part is located between and in contact with the source and the inversion current channel in the channel direction; and a second part formed right below and in contact with the spacer of the gate which is near the drain, wherein the second part is located between and in contact with the drain and the first lightly doped region in the channel direction; wherein the depth of the first lightly doped region is deeper than that of the second lightly doped region.

In one preferable embodiment, the isolation structure includes a local oxidation of silicon (LOCOS) structure, a shallow trench isolation (STI) structure or a chemical vapor deposition (CVD) oxide structure.

In one preferable embodiment, the first lightly doped region is formed by a first self-aligned process which includes: using the dielectric layer and the conductive layer as a mask, and implanting second conductivity type impurities into the operation region in the form of accelerated ions by a first angle with reference to the vertical direction.

In one preferable embodiment, the second lightly doped region is formed by a second self-aligned process which includes: using the spacer layer and the conductive layer as a mask, and implanting second conductivity type impurities, through the spacer layer, into the operation region in the form of accelerated ions by a second angle with reference to the vertical direction.

In one preferable embodiment, steps of forming the semiconductor layer, the isolation structure, the well region, the source, the drain and the first lightly doped region also form a symmetric device on the substrate but the step for forming the second lightly doped region does not form a lightly doped region in the symmetric device; wherein the step for forming the first lightly doped region also forms a source side first lightly doped region in the symmetric device, wherein the source side first lightly doped region is located right below and in contact with a symmetric device spacer and a portion of a symmetric device dielectric layer of the symmetric device which are near a symmetric device source, and the symmetric device source and a symmetric device inversion current channel are separated by the source side first lightly doped region in a symmetric device channel direction.

The objectives, technical details, features, and effects of the present invention will be better understood with regard to the detailed description of the embodiments below.

DESCRIPTION OF THE PREFERABLE EMBODIMENTS

The drawings as referred to throughout the description of the present invention are for illustration only, to show the interrelations among the process steps and the layers; the shapes, thicknesses, and widths are not drawn in actual scale.

Figure 1A:
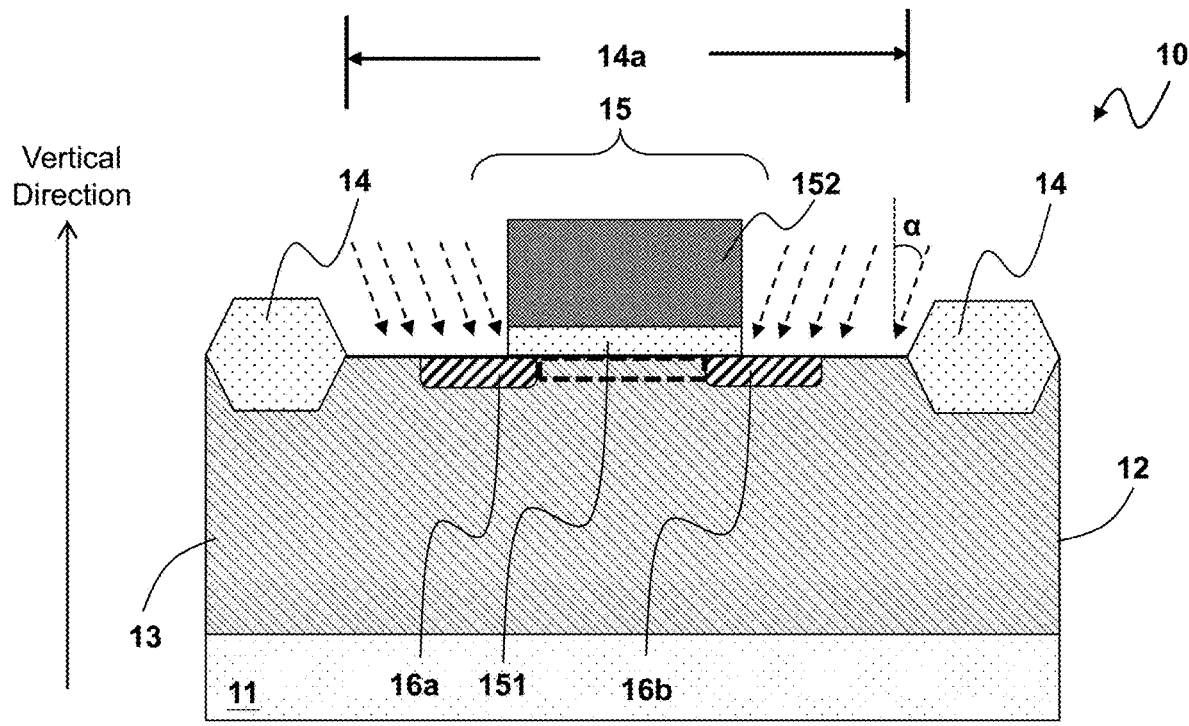
FIG. 1A is a cross-section view showing a step of forming lightly doped regions 16a and 16b in a MOS device 10.
Figure 1B:
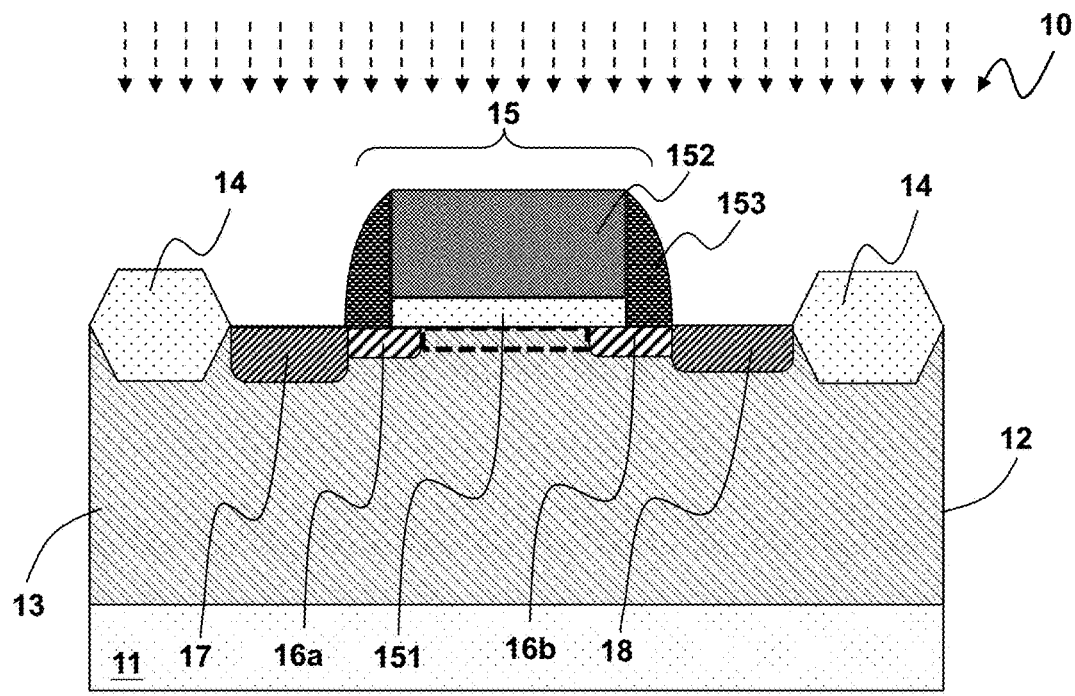
FIG. 1B is a cross-section view showing a step of forming the source 17 and the drain 18 in a conventional metal oxide semiconductor (MOS) device 10.
Figure 2:
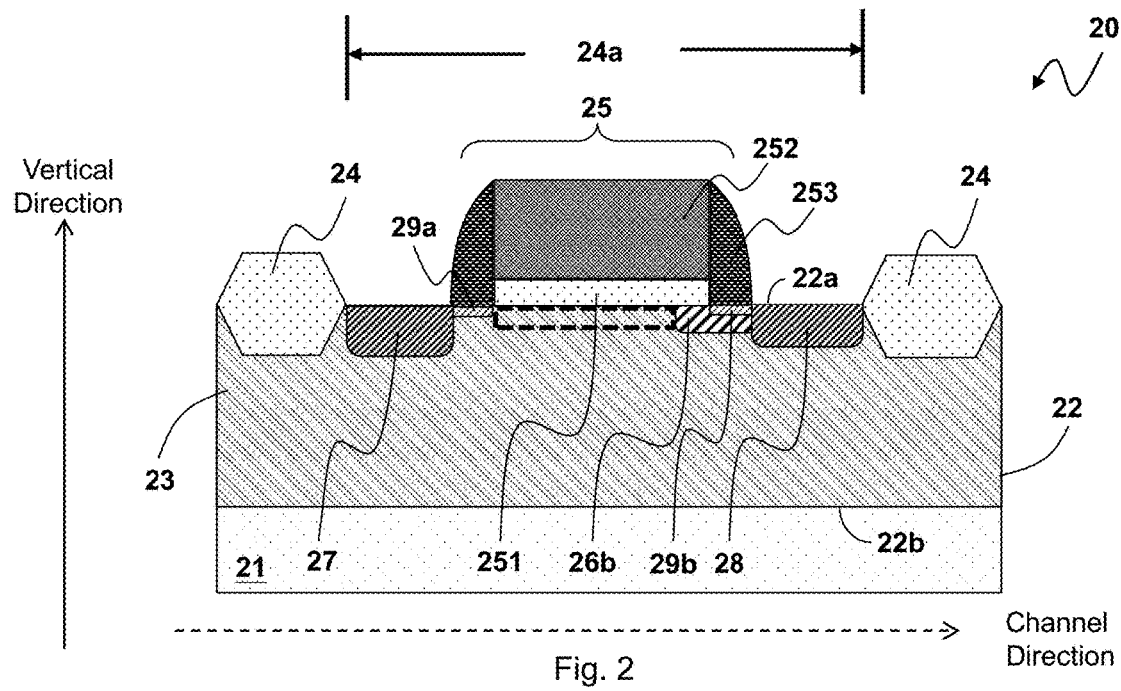
FIG. 2 shows a first embodiment of the present invention.

Please refer to FIG. 2, which shows a first embodiment of the present invention. FIG. 2 shows a cross-section view of a MOS device 20. As show in FIG. 2, the MOS device 20 includes a semiconductor layer layer 22, a well region 23, an isolation structure 24, a gate 25, a first lightly doped region 26b, a source 27, a drain 28 and a second lightly doped region (including a first part 29a and a second part 29b). The semiconductor layer 22 is formed on a substrate 21, and the semiconductor layer 22 has a top surface 22a and a bottom surface 22b that is opposite to the top surface 22a in a vertical direction (as indicated by the direction of the solid arrow in FIG. 2). The substrate 21 is, for example but not limited to, a P-type or N-type semiconductor silicon substrate. The semiconductor layer 22, for example, is formed on the substrate 21 by epitaxy, or a part of the substrate 21 forms the semiconductor layer 22. The method of forming the semiconductor layer 22 is known to a person having ordinary skill in the art, so the details thereof are not redundantly explained here.

Still referring to FIG. 2, the isolation structure 24 is formed on the top surface 22a and in contact with the top surface 22a, for defining an operation region 24a. The isolation structure 24 is not limited to a local oxidation of silicon (LOCOS) structure as shown in the figure, and instead may be a shallow trench isolation (STI) structure or a chemical vapor deposition (CVD) oxide structure.

The well region 23 which has a first conductivity type is formed in the operation region 24a of the semiconductor layer 22, and the well region 23 is located beneath the top surface 22a and in contact with the top surface 22a in the vertical direction. The gate 25 is formed on the top surface 22a in the operation region 24a of the semiconductor layer 22, and a part of the well region 23 is located right under the gate 25 to provide an inversion current channel (as indicated by the dashed line frame in FIG. 2) during ON operation of the MOS device 200.

Still referring to FIG. 2, the gate 25 includes a dielectric layer 251, a conductive layer 252 and a spacer layer 253. The dielectric layer 251 is formed on the top surface 22a and in contact with the top surface 22a, and the dielectric layer 251 is in contact with the well region 23 in the vertical direction. The conductive layer 252 serves as an electrical contact of the gate 25 and is formed on the whole dielectric layer 251 and in contact with the dielectric layer 251. The spacer layer 253 is formed outside of the two sidewalls of the conductive layer 252 and in contact with the conductive layer 252 to serve as an electrical insulation layer.

The source 27 and the drain 28 have a second type conductivity, and the source 27 and the drain 28 are formed in the operation region 24a, beneath the top surface 22a and in contact with the top surface 22a in the vertical direction. The source 27 and the drain 28 are respectively located at two lateral sides of the gate 25, in the well region 23 and near the gate 25, and the inversion current channel is to be formed between the source 27 and the drain 28; from another perspective, the source 27 and the drain 28 are separated by the inversion current channel in a channel direction (as indicated by the direction of the dashed arrow in FIG. 2).

The first lightly doped region 26b which has a second type conductivity is formed in the operation region 24a, beneath the top surface 22a and in contact with the top surface 22a, and the first lightly doped region 26b is located right below the spacer layer 253 near the drain 28 and right below a portion of the dielectric layer 253 near the drain 28. In the channel direction, the first lightly doped region 26b is located between and in contact with the drain 28 and the inversion current channel; from another perspective, the drain 28 and the inversion current channel are separated by the first lightly doped region 26b.

The second lightly doped region (including the first part 29a and the second part 29b) has the second second type conductivity. The second lightly doped region is formed in the operation region 24a, beneath the top surface 24a and in contact with the top surface 24a in the vertical direction. The second lightly doped region includes the first part 29a and the second part 29b. The first part 29a is located right below the spacer 253 of the gate 25 which is near the source 27 and in contact with the spacer 253. In the channel direction, the first part 29a is in contact with the source 27, and the first part 29a is located between the source 27 and the inversion current channel; from another perspective, the source 27 and the inversion current channel are separated by the first part 29a. The second part 29b is located right below the spacer 253 of the gate 25 which is near the drain 28. In the channel direction, the second part 29b is in contact with the drain 28, and the second part 29b is located between the drain 28 and the first lightly doped region 26b, wherein the depth of the first lightly doped region 26b is deeper than the depth of the second lightly doped region 29b. In one preferable embodiment, as shown in FIG. 2, the first lightly doped region 26b is located right below the spacer 253 of the gate 25 which is near the drain 28, but is not located right below the spacer 253 of the gate 25 which is near the source 27.

Note that the term "inverse current channel" means thus. Taking this embodiment as an example, when the high voltage device 20 operates in ON operation due to the voltage applied to the gate 25, an inversion layer is formed beneath the gate 25 so that a conduction current flows through the region of the inversion layer, which is the inverse current channel known to a person having ordinary skill in the art.

Note that the top surface 22a as referred to does not mean a completely flat plane but refers to the surface of the semiconductor layer 22. In the present embodiment, for example, a part of the top surface 22a where the drift oxide region 24 is in contact with has a recessed portion.

Note that the above-mentioned "first conductivity type" and "second conductivity type" mean that impurities of corresponding conductivity types are doped in regions of the MOS device (for example but not limited to the aforementioned well region, source and drain, etc.), so that the regions have the corresponding conductivity types. For example the first conductivity type is N-type and the second conductivity type is P-type, or the first conductivity type is P-type and the second conductivity type is N-type.

The present invention is superior to the prior art in that: taking the embodiment shown in FIG. 2 as an example, compared to the MOS device 10 of the prior art, the first lightly doped region 26b of the MOS device 20 is only located below the spacer layer 253 and the portion of the dielectric layer 251 near the drain 28, but is not located below the spacer layer 253 near the source 27, whereby the breakdown voltage is increased. In addition, the MOS device 20 has the second lightly doped region (including the first part 29a and the second part 29b), and in one preferable embodiment, the depth of the second lightly doped region (including the first part 29a and the second part 29b) is less than the depth of the first lightly doped region 26b to reduce the on-resistance of the MOS device 20; thus, an increase in the on-resistance of the MOS device 20 due to there is no first lightly doped region 16a below the spacer layer 153 (and the portion of the dielectric layer 151) near the source 17 as in the MOS device 10 of the prior art, is compensated. Based on the above, the MOS device of the present invention has a longer effective inversion current channel compared to the MOS device of the prior art; in this way, the MOS device of the present invention can mitigate the short channel effect (SCE) such as the drain-induced barrier lowering (DIBL) effect and the hot carrier effect (HCE), and alleviate the threshold voltage roll-off effect.

From another point of view, under the same specification of threshold voltage roll-off, the MOS device according to the present invention has a smaller length in the channel direction, which means that the on-resistance is lower.

In one preferable embodiment, the first lightly doped region 26b is formed by a first self-aligned process, and the first self-aligned process includes: using the conductive layer 252 and the dielectric layer 251 as a mask, and implanting second conductivity type impurities into the operation region 24a in the form of accelerated ions by a first angle α with reference to the vertical direction, to form the first lightly doped region 26b. In one preferable embodiment, the first lightly doped region 26b is not located right below the spacer layer 253 of the gate 25 which is near the source 27.

In one preferable embodiment, the second lightly doped region (including the first part 29a and the second part 29b) is formed by a second self-aligned process, and the second self-aligned process includes: using the spacer layer 253 as a mask, and implanting second conductivity type impurities, through the spacer layer 253, into the operation region 24a in the form of accelerated ions by a second angle β with reference to the vertical direction, to form the second lightly doped region (including the first part 29a and the second part 29b).

Figure 3:
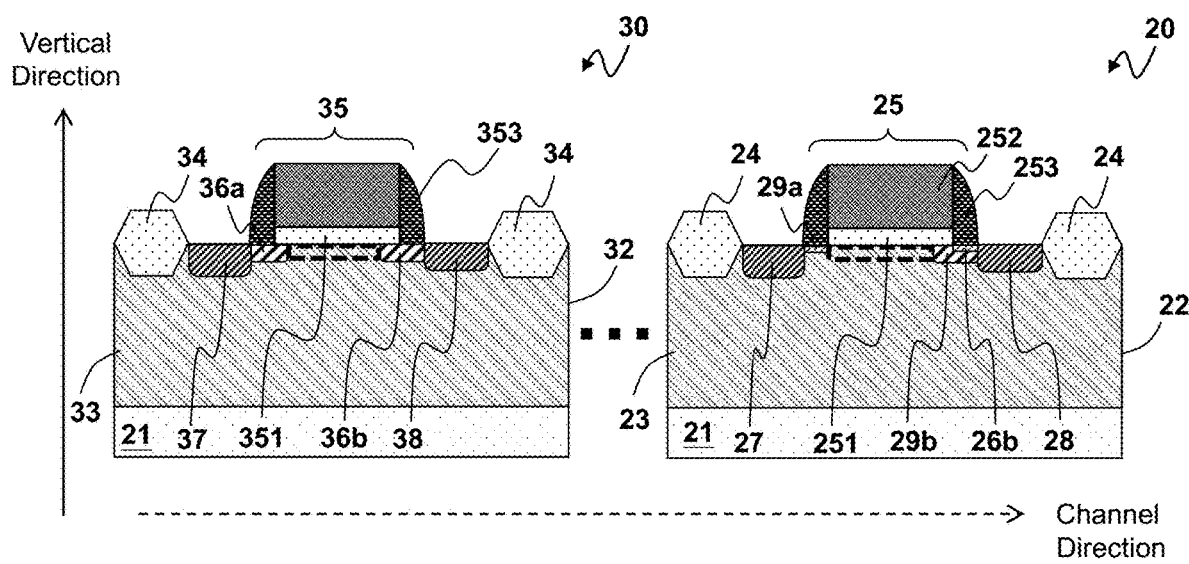
FIG. 3 shows a second embodiment of the present invention.

Please refer to FIG. 3, which shows a second embodiment of the present invention. In this embodiment, the Mos device 20 and a symmetric device 30 are formed on the same substrate 21 at the same time by the same process steps, wherein the steps for forming the semiconductor layer 22, the isolation structure 24, the well region 23, the gate 25, the source 27, the drain 28 and the first lightly doped region 26b also form a symmetric device semiconductor layer 32, a symmetric device isolation structure 34, a symmetric device well region 33, a symmetric device gate 35, a symmetric device source 37, a symmetric device drain 38, a source side first lightly doped region 36a and a drain side first lightly doped region 36b of the symmetric device 30 on the substrate 21, but the step for forming the second lightly doped region (including the first part 29a and the second part 29b) does not form a lightly doped region in the symmetric device 30. Note that the step for forming the first lightly doped region 26b also forms the source side first lightly doped region 36a. The source side first lightly doped region 36a is located right below and in contact with a symmetric device spacer 353 and a portion of a dielectric layer 351 of the symmetric device gate 35 which are near the symmetric device source 37. In the channel direction, the source side first lightly doped region 36a is located between and in contact with the symmetric device source 37 and the symmetric device inversion current channel (as indicated by the dashed line frame in FIG. 3); from another perspective, the symmetric device source 37 and the inversion current channel are separated by the source side first lightly doped region 36a.

Figure 4A:
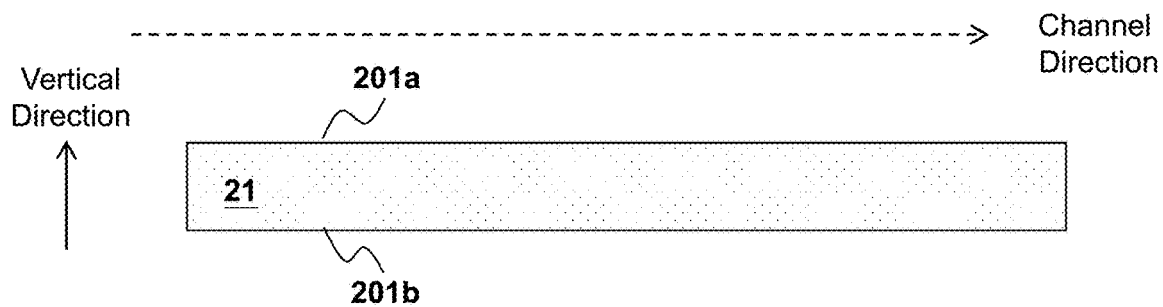
FIGS. 4A to 4F show a third embodiment of the present invention.
Figure 4B:
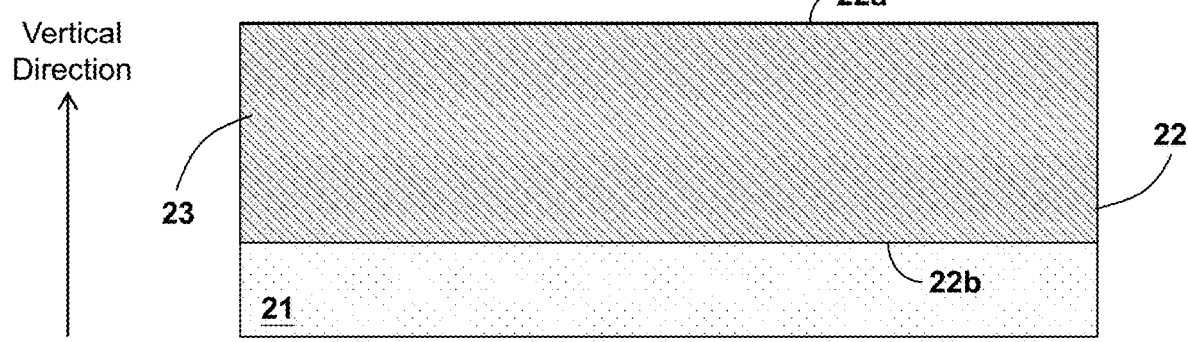

Please refer to FIGS. 4A to 4F, which show a third embodiment of the present invention. This embodiment is a manufacturing method of the MOS device 20 of the present invention, which is illustrated by cross-section views. As shown FIG. 4A, first, a substrate 21 is provided. Next, as shown in FIG. 4B, a semiconductor layer 22 is formed on the substrate 21. The semiconductor layer 22 which is formed on the substrate 21 has a top surface 22a and a bottom surface 22b that is opposite to the top surface 22a in the vertical direction. The substrate 21 is, for example but not limited to, a P-type or N-type semiconductor silicon substrate. The semiconductor layer 22 is formed on the substrate 21, for example, by epitaxy, or a part of the substrate 21 forms the semiconductor layer 22. The method of forming the semiconductor layer 22 is known to a person having ordinary skill in the art, so the details thereof are not redundantly explained here. Next, for example, first conductivity type impurities are implanted into an operation region 24a (to be defined later) in the form of accelerated ions by an ion implantation process step, as indicated by the dashed line in FIG. 4B, to form a well region 23 in the operation region 24a of the semiconductor layer 22, wherein the well region 23 is located beneath the top surface 22a and in contact with the top surface 22a in the vertical direction. The well region 23 has the first conductivity type.

Figure 4C:
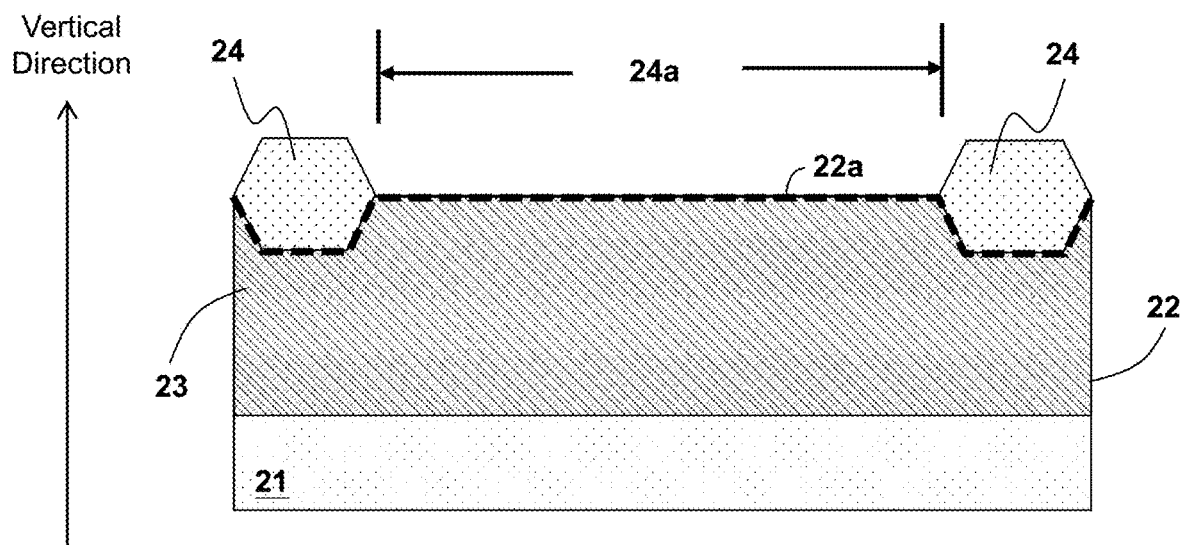

Referring to FIG. 4C, next, an isolation structure 24 is formed on the top surface 22a and in contact with the top surface 22a. The isolation structure 24 defines the operation region 24a. The isolation structure 24 is, for example but not limited to, a local oxidation of silicon (LOCOS) structure, but it may be a shallow trench isolation (STI) structure or a chemical vapor deposition (CVD) oxide structure, which is known to a person having ordinary skill in the art, so the details thereof are not redundantly explained here. The top surface 22a is illustrated by the thick broken line in the figure.

Next, referring to FIG. 4D, a dielectric layer 251 and a conductive layer 252 of a gate 25 are formed on the top surface 22a in the operation region 24a of the semiconductor layer 22, wherein a portion of the well region 23 which is located right below the dielectric layer 251 and the conductive layer 252 of the gate 25 serves as the inversion current channel (as indicated by the dashed line frame in FIG. 4E) during ON operation of the MOS device 20. The dielectric layer 251 is formed on the top surface 22a and in contact with the top surface 22a, and the dielectric layer 251 is in contact with the well region 23 in the vertical direction. The conductive layer 252 serves as an electrical contact of the gate 25; the conductive layer 252 is formed on the whole dielectric layer 251 and in contact with the dielectric layer 251.

Figure 4D:
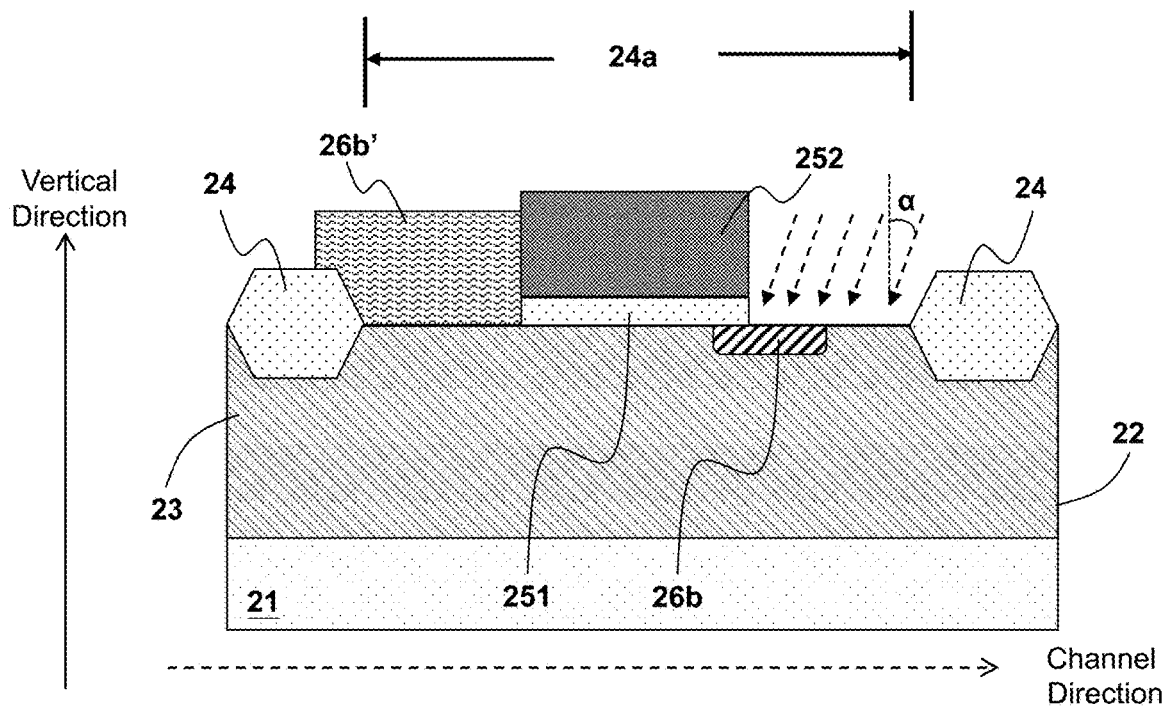

Next, still referring to FIG. 4D, a first lightly doped region 26b is formed beneath the top surface 22a and in contact with the top surface 22a in the operation region 24a. The first lightly doped region 26b which has the second conductivity type is located right below and in contact with the spacer 253 and a portion of the dielectric layer 251 of the gate 25 which are near the drain 28 (see FIG. 4F). In the channel direction, the first lightly doped region 26b is located between and in contact with the drain 28 and the inversion current channel; from another perspective, the drain 28 and the inversion current channel are separated by the first lightly doped region 26b. The first lightly doped region 26b is formed, for example, by a first self-aligned process which includes steps of: using the conductive layer 252, the dielectric layer 251 and a photoresist layer 26b' formed by a lithography process as a mask, and implanting second conductivity type impurities into the well region 23 in the form of accelerated ions by a first angle α with reference to the vertical direction, to form the first lightly doped region 26b.

Figure 4E:
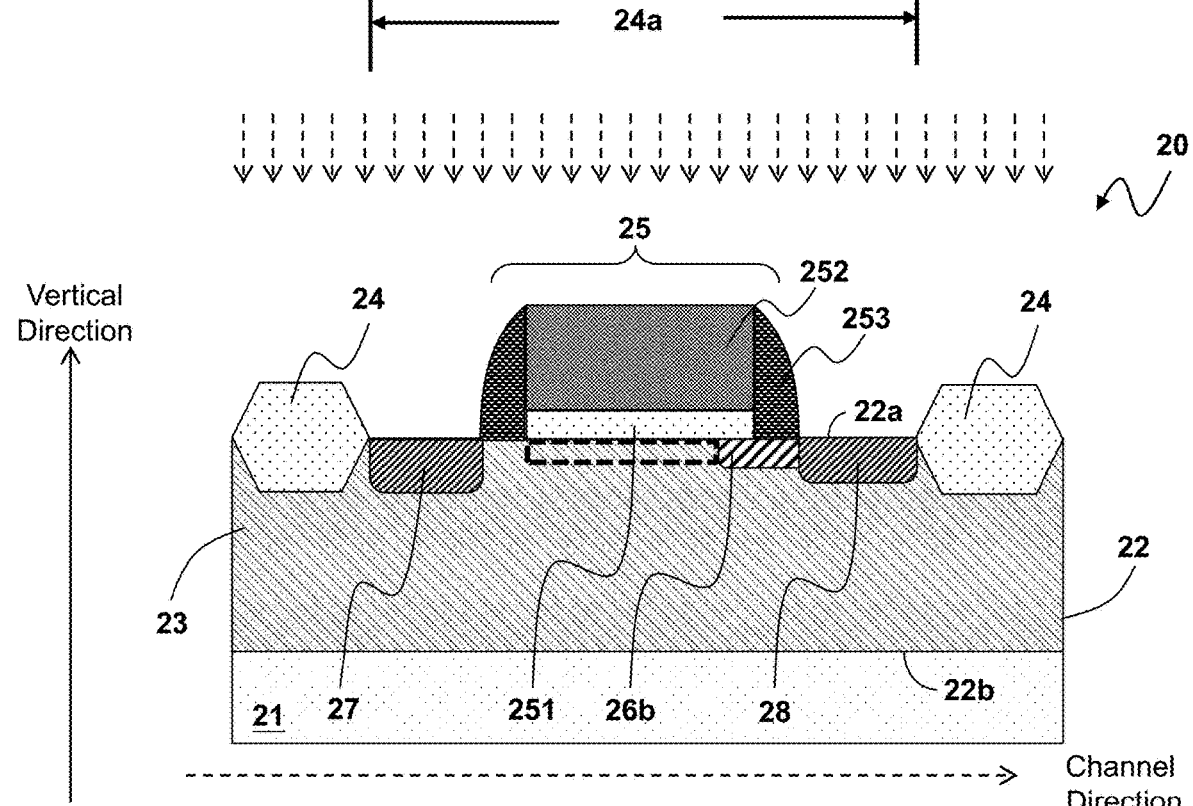

Next, referring to FIG. 4E, a source 27 and a drain 28 are formed beneath the top surface 22a and in contact with the top surface 22a in the operation region 24a. The source 27 and the drain 28 which have the second conductivity type are respectively located at two lateral sides of the gate 25, in the well region 23 and near the gate 25, and the inversion current channel is to be formed between the source 27 and the drain 28; from another perspective, the source 27 and the drain 28 are separated by the inversion current channel in a channel direction (as indicated by the direction of the dashed arrow in FIG. 4E).

Figure 4F:
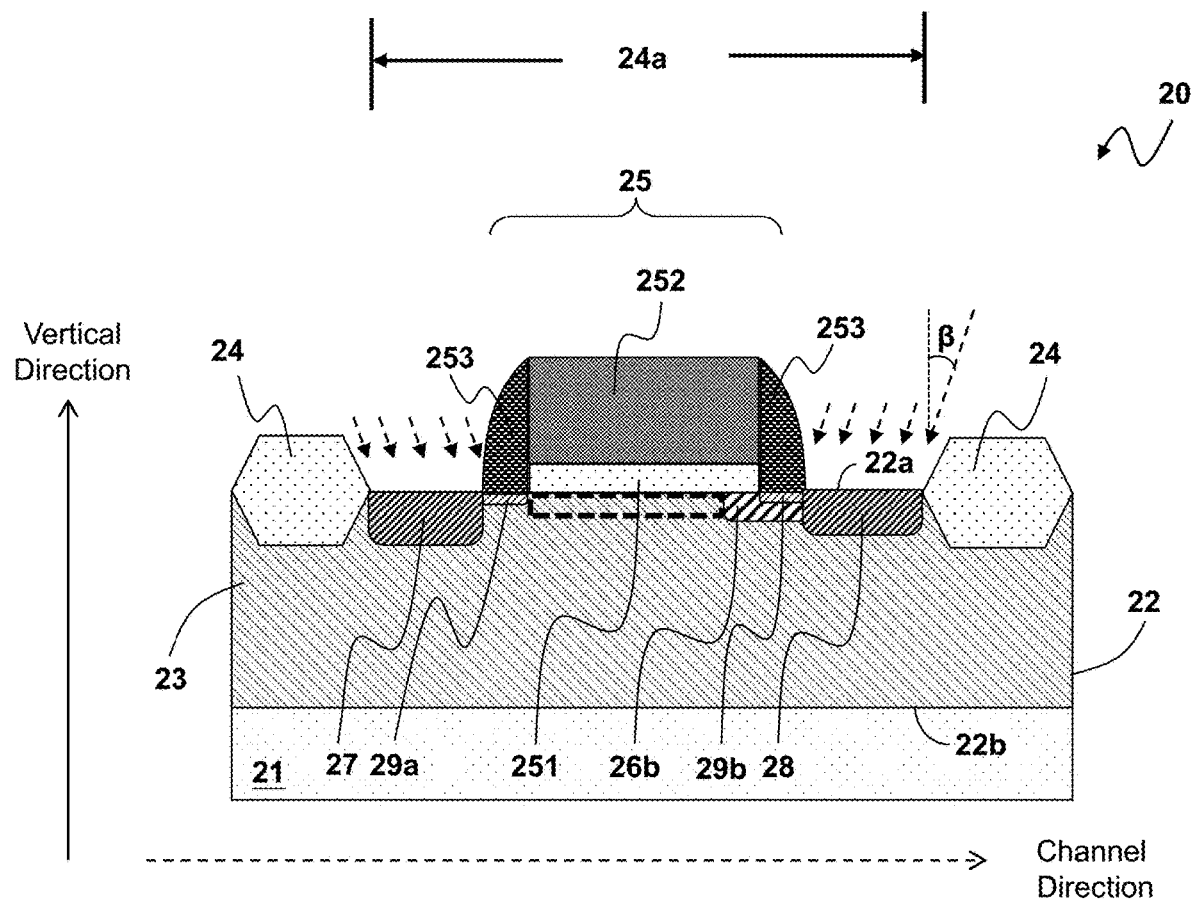

Next, referring to FIG. 4F, a second lightly doped region (including the first part 29a and the second part 29b) is formed beneath the surface 22a and in contact with the top surface 22a in the operation region 24a; the second lightly doped region (including the first part 29a and the second part 29b) has the second conductivity type. The second lightly doped region includes the first part 29a and the second part 29a, wherein the first part 29a is located right below and in contact with the spacer 253 of the gate 25 which is near the source 27. In the channel direction, the first part 29a is in contact with the source 27, and the first part 29a is located between and in contact with the source 27 and the inversion current channel; from another perspective, the source 27 and the inversion current channel are separated by the first part 29a in the channel direction. The second part 29b is located right below the spacer 253 of the gate 25 which is near the drain 28, and the second part 29b is located between and in contact with the drain 28 and the first lightly doped region 26b, wherein the depth of the first lightly doped region 26b is deeper than the depth of the second lightly doped region (including the first part 29a and the second part 29b).

The second lightly doped region (including the first part 29a and the second 29b), for example, is formed by a second self-aligned process which includes: using the spacer 253 layer and the conductive layer 252 as a mask, and implanting second conductivity type impurities, through the spacer layer 253, into the operation region 24a in the form of accelerated ions by a second angle β with reference to the vertical direction, to form the second lightly doped region (including the first part 29a and the second part 29b). In one preferable embodiment, the first angle α is greater than the second angle β.

Figure 5A:
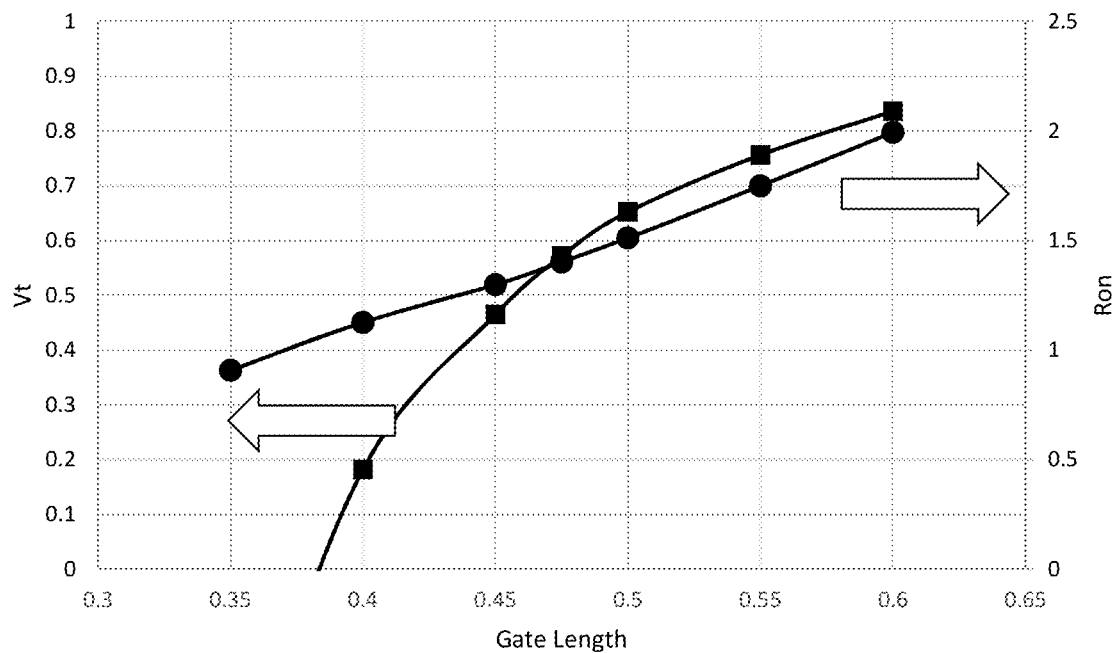
FIGS. 5A and 5B are characteristic diagrams showing the threshold voltage and the on-resistance of an N-type MOS device according to the prior art and the present invention, respectively.
Figure 5B:
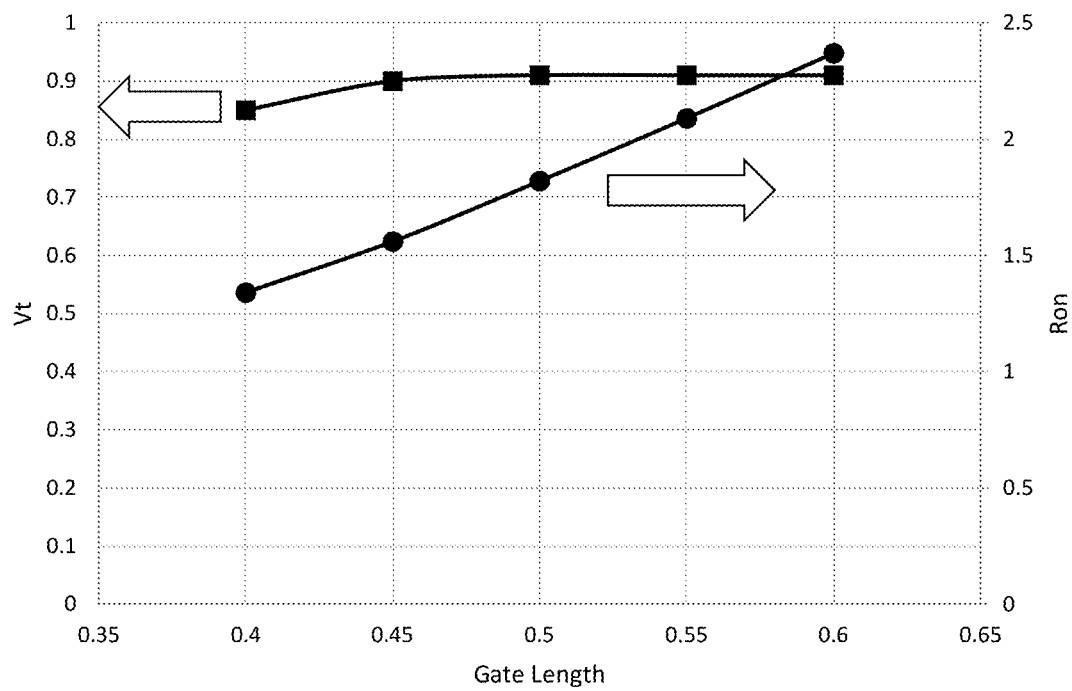

FIGS. 5A and 5B are characteristic diagrams showing the threshold voltage and the on-resistance of an N-type MOS device according to the prior art and the present invention, respectively, which show data at different gate lengths (the horizontal axis), and corresponding threshold voltages Vt (the left vertical axis) and corresponding on-resistances Ron (the right vertical axis). As shown in FIG. 5A, in the N-type MOS device of the prior art, when the gate length is decreased from 0.6 length units to 0.4 length units, the threshold voltage Vt is decreased from about 0.84 voltage units to about 0.18 voltage units, which is a difference of 0.66 voltage units and an obvious threshold voltage drop. In contrast, as shown in FIG. 5B, according to the N-type MOS device of the present invention, when the gate length is decreased from 0.6 length units to 0.4 length units, the threshold voltage Vt is decreased from about 0.91 voltage units to about 0.85 voltage units, which is a difference of only 0.06 voltage units; the threshold voltage Vt does not fall significantly, which is much better than the prior art. From another point of view, when it is required to use a device having a threshold voltage of more than 0.8 voltage units, according to the prior art, it is required to use an N-type MOS device having a gate length of more than 0.6 units, but according to the present invention, an N-type MOS device having a gate length of 0.4 length unit (or even lower) can be used; thus, according to the present invention, the on-resistance Ron can be greatly reduced, and the operation speed of the N-type MOS device can be improved, because of the smaller gate length. At the same gate length, the on-resistance Ron of the present invention is approximately the same as the on-resistance of the prior art.

Figure 6A:
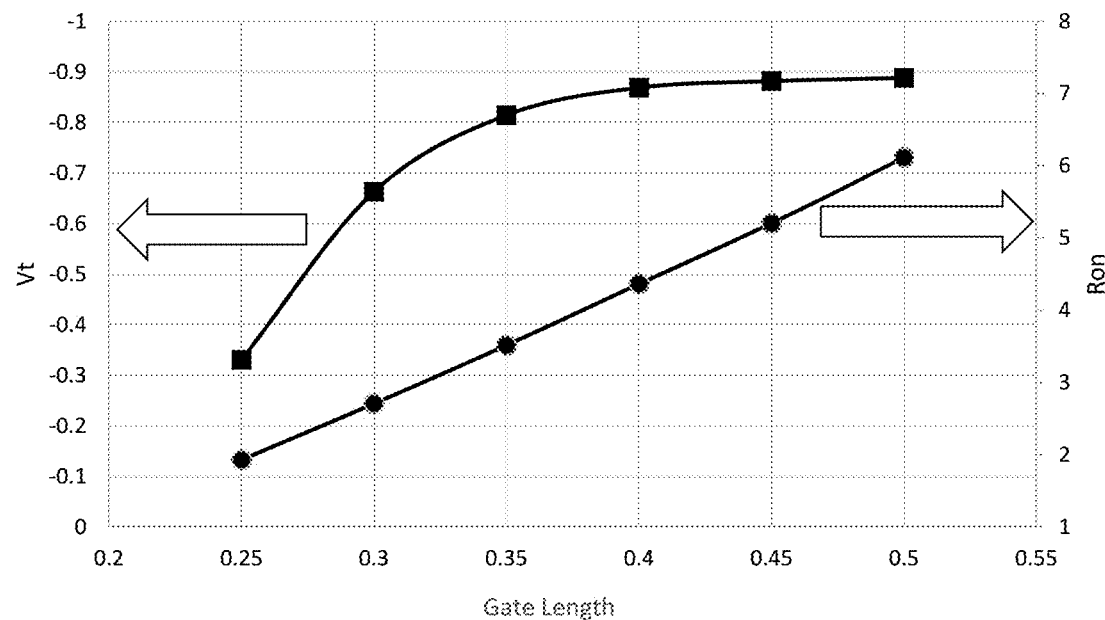
FIGS. 6A and 6B are characteristic diagrams showing the threshold voltage and the on-resistance of a P-type MOS device according to the prior art and the present invention, respectively.
Figure 6B:
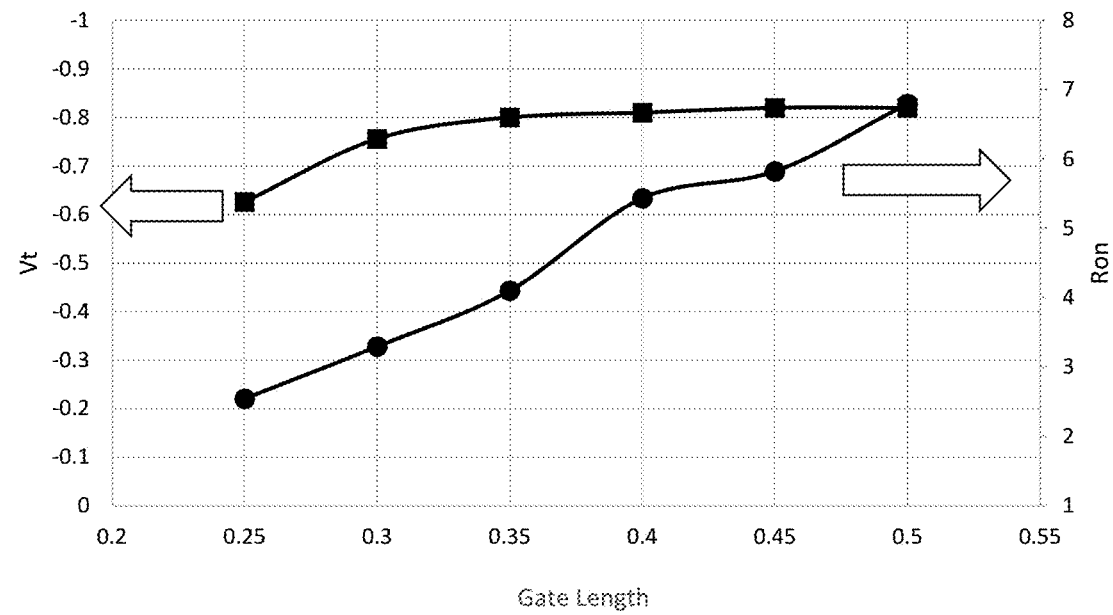

FIGS. 6A and 6B are characteristic diagrams showing the threshold voltage and the on-resistance of a P-type MOS device according to the prior art and the present invention, respectively, which show data at different gate lengths (the horizontal axis), and corresponding threshold voltages Vt (the left vertical axis) and corresponding on-resistances Ron (the right vertical axis). As shown in FIG. 6A, in the P-type MOS device of the prior art, when the gate length is decreased from 0.5 length units to 0.25 length units, the absolute value of the threshold voltage Vt is decreased from about 0.89 voltage units to about 0.33 voltage units, which is a difference of 0.56 voltage units and an obvious threshold voltage drop. In contrast, as shown in FIG. 6B, according to the P-type MOS device of the present invention, when the gate length is decreased from 0.5 length units to 0.25 length units, the absolute value of the threshold voltage Vt is decreased from about 0.82 voltage units to about 0.63 voltage units, which is a difference of only 0.19 voltage units; the threshold voltage Vt does not fall significantly, which is much better than the prior art. From another point of view, when it is required to use a device having a threshold voltage of more than 0.7 voltage units, according to the prior art, it is required to use an N-type MOS device having a gate length of more than 0.35 length units, but according to the present invention, a P-type MOS device having a gate length of less than 0.3 length unit can be used; thus, according to the present invention, the on-resistance Ron can be greatly reduced, and the operation speed of the P-type MOS device can be improved because of the smaller gate length. At the same gate length, the on-resistance Ron of the present invention is approximately the same as the on-resistance of the prior art.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. The various embodiments described above are not limited to being used alone; two embodiments may be used in combination, or a part of one embodiment may be used in another embodiment. For example, other process steps or structures, such as a deep well region, may be added. For another example, the lithography technique is not limited to the mask technology but it can be electron beam lithography, immersion lithography, etc. Therefore, in the same spirit of the present invention, those skilled in the art can think of various equivalent variations and modifications, which should fall in the scope of the claims and the equivalents.

What is claimed is:

1. A metal oxide semiconductor (MOS) device comprising:
    a semiconductor layer formed on a substrate, wherein the semiconductor layer has a top surface and a bottom surface that is opposite to the top surface in a vertical direction;
    an isolation structure formed on and in contact with the top surface, wherein the isolation structure defines an operation region;
    a well region having a first conductivity type, wherein the well region is formed in the semiconductor layer, and the well region is formed beneath and in contact with the top surface in the vertical direction;
    a gate formed on the top surface in the operation region, wherein a part of the well region is located right below and in contact with the gate to provide an inversion current channel during ON operation of the MOS device, wherein the gate includes:
        a dielectric layer formed on the top surface, wherein the dielectric layer is in contact with the top surface and in contact with the well region in the vertical direction;
        a conductive layer serving as an electrical contact of the gate, wherein the conductive layer is formed on the whole dielectric layer and in contact with the dielectric layer; and
        a spacer layer formed outside of the two sidewalls of the conductive layer, wherein the spacer layer serves as an electrical insulation layer of the gate;
    a source and a drain both having a second conductivity type, wherein the source and the drain are formed in the operation region, beneath and in contact with the top surface in the vertical direction, wherein the source and the drain are respectively located at two lateral sides of the gate, in the well region and near the gate, and the inversion current channel is located between the source and the drain in a channel direction which is a direction perpendicular to the vertical direction;

a first lightly doped region having the second conductivity type, the first lightly doped region being formed in the operation region, beneath and in contact with the top surface in the vertical direction, wherein the first lightly doped region is located right below the spacer layer and a portion of the dielectric layer of the gate which are near the drain, and the first lightly doped region is located between and in contact with the drain and the inversion current channel in the channel direction; and a second lightly doped region having the second conductivity type, the second lightly doped region being formed in the operation, beneath and in contact with the top surface in the vertical direction, wherein the second lightly doped region includes:

a first part formed right below and in contact with the spacer of the gate which is near the source, wherein the first part is located between and in contact with the source and the inversion current channel in the channel direction; and a second part formed right below and in contact with the spacer of the gate which is near the drain, wherein the second part is located between and in contact with the drain and the first lightly doped region in the channel direction;

wherein the depth of the first lightly doped region is deeper than that of the second lightly doped region.

2. The MOS device of claim 1, wherein the isolation structure includes a local oxidation of silicon (LOCOS) structure, a shallow trench isolation (STI) structure or a chemical vapor deposition (CVD) oxide structure.

3. The MOS device of claim 1, wherein the first lightly doped region is not located right below the spacer layer of the gate which is near the source.

4. The MOS device of claim 1, wherein the first lightly doped region is formed by a first self-aligned process which includes: using the dielectric layer and the conductive layer as a mask, and implanting second conductivity type impurities into the operation region in the form of accelerated ions by a first angle with reference to the vertical direction.

5. The MOS device of claim 1, wherein the second lightly doped region is formed by a second self-aligned process which includes: using the spacer layer and the conductive layer as a mask, and implanting second conductivity type impurities, through the spacer layer, into the operation region in the form of accelerated ions by a second angle with reference to the vertical direction.

6. A manufacturing method of a metal oxide semiconductor (MOS) device, comprising:

forming a semiconductor layer formed on a substrate, wherein the semiconductor layer has a top surface and a bottom surface that is opposite to the top surface in a vertical direction;

forming an isolation structure on and in contact with the top surface, wherein the isolation structure defines an operation region;

forming a well region having a first conductivity type in the semiconductor layer, wherein the well region is formed beneath and in contact with the top surface in the vertical direction;

forming a gate on the top surface in the operation region, wherein a part of the well region is located right below and in contact with the gate to provide an inversion current channel during ON operation of the MOS device, wherein the gate includes:

a dielectric layer formed on the top surface, wherein the dielectric layer is in contact with the top surface and in contact with the well region in the vertical direction;

a conductive layer serving as an electrical contact of the gate, wherein the conductive layer is formed on the whole dielectric layer and in contact with the dielectric layer; and a spacer layer formed outside of the two sidewalls of the conductive layer, wherein the spacer layer serves as an electrical insulation layer of the gate;

forming a first lightly doped region having a second conductivity type in the operation region, beneath and in contact with the top surface in the vertical direction, wherein the first lightly doped region is located right below the spacer layer and a portion of the dielectric layer of the gate which are near the drain, and the first lightly doped region is located between and in contact with the drain and the inversion current channel in the channel direction; and forming a source and a drain both having the second conductivity type in the operation region, beneath and in contact with the top surface in the vertical direction, wherein the source and the drain are respectively located at two lateral sides of the gate, in the well region and near the gate, and the inversion current channel is between the source and the drain in the channel direction; and forming a second lightly doped region having the second conductivity type in the operation, beneath and in contact with the top surface in the vertical direction, wherein the second lightly doped region includes:

a first part formed right below and in contact with the spacer of the gate which is near the source, wherein the first part is located between and in contact with the source and the inversion current channel in the channel direction; and a second part formed right below and in contact with the spacer of the gate which is near the drain, wherein the second part is located between and in contact with the drain and the first lightly doped region in the channel direction;

wherein the depth of the first lightly doped region is deeper than that of the second lightly doped region.

7. The manufacturing method of the MOS device of claim 6, wherein the isolation structure includes a local oxidation of silicon (LOCOS) structure, a shallow trench isolation (STI) structure or a chemical vapor deposition (CVD) oxide structure.

8. The manufacturing method of the MOS device of claim 6, wherein the first lightly doped region is not located right below the spacer of the gate which is near the source.

9. The manufacturing method of the MOS device of claim 6, wherein the first lightly doped region is formed by a first self-aligned process which includes: using the dielectric layer and the conductive layer as a mask, and implanting second conductivity type impurities into the operation region in the form of accelerated ions by a first angle with reference to the vertical direction.

10. The manufacturing method of the MOS device of claim 6, wherein the second lightly doped region is formed by a second self-aligned process which includes: using the spacer layer and the conductive layer as a mask, and implanting second conductivity type impurities, through the spacer layer, into the operation region in the form of accelerated ions by a second angle with reference to the vertical direction.

11. The manufacturing method of the MOS device of claim 6, wherein steps of forming the semiconductor layer, the isolation structure, the well region, the source, the drain and the first lightly doped region also form a symmetric device on the substrate but the step for forming the second lightly doped region does not form a lightly doped region in the symmetric device; wherein the step for forming the first lightly doped region also forms a source side first lightly doped region in the symmetric device, wherein the source side first lightly doped region is located right below and in contact with a symmetric device spacer and a portion of a symmetric device dielectric layer of the symmetric device which are near a symmetric device source, and the symmetric device source and a symmetric device inversion current channel are separated by the source side first lightly doped region in a symmetric device channel direction.

* * * * *